United States Patent
Jany et al.

(10) Patent No.: US 7,056,842 B2
(45) Date of Patent: Jun. 6, 2006

(54) METHOD AND APPARATUS FOR NON-AGGRESSIVE PLASMA-ENHANCED VAPOR DEPOSITION OF DIELECTRIC FILMS

(75) Inventors: Christophe Jany, Fontainebleau (FR); Michel Puech, Metz-Tessy (FR)

(73) Assignee: Alcatel, Paris (FR)

( * ) Notice: Subject to any disclaimer, the term of this patent is extended or adjusted under 35 U.S.C. 154(b) by 66 days.

(21) Appl. No.: 10/902,582

(22) Filed: Jul. 30, 2004

(65) Prior Publication Data

US 2005/0026404 A1 Feb. 3, 2005

(30) Foreign Application Priority Data

Jul. 31, 2003 (FR) .................................. 03 09422

(51) Int. Cl.
*H01L 21/31* (2006.01)

(52) U.S. Cl. ...................... 438/788; 438/724; 438/758; 438/761; 438/769; 438/775; 438/778; 438/785; 438/787; 438/791; 438/792; 438/798; 438/932

(58) Field of Classification Search ................ 438/788, 438/724, 758, 761, 769, 775, 778, 785, 787, 438/791, 792, 798, 932
See application file for complete search history.

(56) References Cited

U.S. PATENT DOCUMENTS

| 4,987,346 A | 1/1991 | Katzschner et al. |
| 5,304,250 A | 4/1994 | Sameshima et al. |
| 5,894,159 A * | 4/1999 | Mori et al. .................. 257/406 |
| 6,444,327 B1 | 9/2002 | Yuda et al. |
| 6,960,537 B1 * | 11/2005 | Shero et al. ................. 438/775 |
| 2002/0185226 A1 | 12/2002 | Lea et al. |
| 2003/0056726 A1 * | 3/2003 | Holst et al. .................. 118/715 |
| 2003/0232495 A1 * | 12/2003 | Moghadam et al. ......... 438/623 |
| 2004/0048492 A1 * | 3/2004 | Ishikawa et al. ............. 438/787 |
| 2004/0203177 A1 * | 10/2004 | Davis et al. .................. 438/14 |
| 2005/0001555 A1 * | 1/2005 | Parsons et al. .......... 315/111.21 |

FOREIGN PATENT DOCUMENTS

| EP | 0 488 393 A2 | 6/1992 |
| EP | 1 220 272 A1 | 7/2002 |
| WO | WO 0070117 A | 11/2000 |
| WO | WO 02/078043 A2 | 10/2002 |

OTHER PUBLICATIONS

Takashi Yunogami et al, "Development of Neutral-Beam Assisted Etcher", Journal of Vacuum Science and Technology; Part A, American Institute of Physics, New York, US, vol. 13, No. 3, Part 1, May 1, 1995, pp. 952-958, XP000531596.
Patent Abstracts of Japan, vol. 1996, No. 10, Oct. 31, 19896 corresponding to JP 08 167596 A (Sony Corp. dated Jun. 25, 1996.

* cited by examiner

*Primary Examiner*—B. William Baumeister
*Assistant Examiner*—Victor V. Yevsikov
(74) *Attorney, Agent, or Firm*—Sughrue Mion, PLLC

(57) ABSTRACT

According to the invention, while performing plasma-enhanced chemical vapor deposition on a substrate by exposing the substrate in a vacuum to a flow of particles generated by a plasma, which particles react to form a passivation layer on the substrate, a grid is interposed between the plasma and the substrate, thereby reducing the flow of charged particles towards the substrate while conserving a flow of neutral particles. The grid is formed of metal wires that are crossed at a pitch that is less than two or three times the Debye length ($\lambda D$) of the plasma used, at least at the beginning of deposition. The aging properties of semiconductor components made by such a method is thereby improved.

3 Claims, 3 Drawing Sheets

METHOD AND APPARATUS FOR NON-AGGRESSIVE PLASMA-ENHANCED VAPOR DEPOSITION OF DIELECTRIC FILMS

The present invention relates to methods of fabricating semiconductor components in which at least one step of plasma-enhanced chemical vapor deposition is performed consisting in exposing a semiconductor substrate in a vacuum to a flow of particles generated by a plasma, the particles reacting to form a passivation layer on the substrate of a material that has dielectric properties.

Traditional chemical vapor deposition methods, which are in widespread use for depositing films on substrates, lead to the substrates becoming heated to high temperatures. Such methods can therefore be used only for substrates that withstand high temperatures without significant degradation.

To make deposits on substrates that are relatively fragile, it is common practice to use plasma-enhanced chemical vapor deposition (PECVD), during which method a substrate is exposed in a vacuum to a flow of particles generated by a plasma and which reacts to form a passivation layer on the substrate. Such a deposit can be applied at a lower temperature, of the order of 250° C. to 400° C. However, most plasma sources lead to performing the method at a temperature which is still too high for certain fragile semiconductor substrates, and the semiconductor components made in this way present progressive aging defects which rapidly make them unsuitable for use.

Proposals have also been made to use an inductively-coupled plasma (ICP) source which consists in generating the plasma by electromagnetic excitation by means of a loop antenna placed outside the plasma-generation compartment, the wall of the compartment being made of a dielectric material. Such an ICP source can allow operation to take place at a lower temperature without deliberately heating the substrate. The substrate is then at a temperature of about 50° C. during deposition. It is found that this improves the aging of the semiconductor component.

Rapid and unacceptable aging is also observed on items having a fragile semiconductor substrate such as indium phosphide InP, gallium arsenide GaAs, or even substrates of silicon or of germanium.

There continues to exist a need to improve the properties of semiconductor components over time so as to enable them to conserve their properties over a long lifetime.

For example, in positive intrinsic negative (PIN) diodes for detecting light, the substrate is made of indium phosphide. Over time, PIN diodes made by present-day methods lose their characteristic of being insulating in the absence of light. This leads to undesirable leakage current which reduces the overall detection ability of the diode and its sensitivity.

In order to improve the aging properties of the diode, attempts have been made to passivate the substrate by depositing silicon nitride using a PECVD method, with such a deposit serving in particular to counter the effect of moisture.

However, such a deposit does not have sufficient effectiveness over time, and the diode progressively loses its character of being insulating in the absence of light.

The present invention results from the observation whereby the progressive aging defects of certain semiconductor components such as PIN diodes are apparently due to degradation of the interface between the substrate and the deposited layer while the passivation layers are being deposited. At the beginning of the deposition step, the substrate is bare and can itself be degraded by the action of the plasma.

It is assumed that this degradation is produced by the action of charged particles in the plasma, bombarding the substrate and degrading its surface layer.

If the negative bias of the substrate is reduced, e.g. by putting it at a floating potential, that does not suffice to prevent the action of charged particles on the substrate.

The problem posed by the present invention is to further improve the aging properties of semiconductor components made using at least one step involving a plasma-enhanced chemical vapor deposition method, so that the resulting semiconductor component conserves its properties over time.

Since full advantage has been taken from reducing treatment temperature, the invention seeks to find additional means for reducing the aggressive nature of the plasma relative to the substrate during steps of depositing a dielectric film on a substrate.

The invention seeks simultaneously to protect the substrate while not significantly reducing the speed at which the deposit is made on the substrate.

In order to achieve these objects, and others, a first aspect of the invention provides a particular method of depositing dielectric films by plasma-enhanced chemical vapor deposition, in which a substrate is exposed in a vacuum to a flow of particles generated by a plasma, which particles react to form a passivation layer on the substrate. A selective trap is interposed between the plasma and the substrate, thereby reducing the flow of charged particles towards the substrate while conserving the flow of neutral particles.

It will be understood that by reducing the flow of charged particles, the selective trap avoids degrading the surface layer of the substrate, at least at the beginning of the deposition. Similarly, by conserving the flow of neutral particles, the selective trap avoids significantly reducing deposition rates.

According to the invention, the deposition method comprises two successive steps:

a) an initial step of non-aggressive deposition, during which the selective trap effectively reduces the flow of charges particles; and b) a following step of rapid deposition, during which the selective trapping effect is inhibited, at least to a great extent.

It is found that degradation of the surface layer of the substrate takes place essentially at the beginning of deposition, a period during which the substrate is not protected by the deposited layer against aggression by particles of the plasma. Thus, during the initial deposition step, deposition is performed in a "non-aggressive" manner so as to avoid degrading the surface layer of the substrate. Subsequently, once a certain amount of deposition has been achieved, a fast deposition step is performed by inhibiting the retarding effect of the selective trap, so as to further increase the rate at which the deposit is made.

In practice, it is possible to inhibit the effect of the selective trap in particular by one or other of the following two operations: a first operation consists in modifying the trap, e.g. by moving it. A second operation consists in modifying the properties of the plasma, by causing the charged particles that are present in the plasma to be trapped during the initial step of non-aggressive deposition, while allowing the particles to pass through the trap without seeing it during a second step of rapid deposition.

In a second aspect, the invention provides apparatus for depositing dielectric films on a substrate by a plasma-enhanced chemical vapor deposition method as defined above, the apparatus comprising:

a source of high-density ion plasma;

means for projecting plasma particles onto the substrate;

a selective trap for eliminating or significantly reducing the flow of charged particles towards the substrate, while conserving a flow of neutral particles which react to form a passivation layer on the substrate; and means for selectively retracting the trap, such that the trap is interposed in the flow of particles during an initial step of non-aggressive deposition, and the trap is retracted from the flow of particles during a following step of rapid deposition.

In practice, the selective trap may advantageously comprise a metal grid interposed between the plasma and the substrate.

In order to have a selective trap effect, the metal grid may be formed, for example, by metal wires crossed at a pitch P that is determined as a function of the characteristics of the plasma, so as to block the flow of charged particles, at least during the initial step of non-aggressive deposition.

In practice, the pitch P of the grid needs to be less than two or three times the Debye length $\lambda D$ of the plasma used, at least at the beginning of deposition.

Alternatively, the invention provides apparatus for depositing dielectric films on a substrate by a plasma-enhanced chemical vapor deposition method as defined above, the apparatus comprising:

a source of high-density ion plasma;

means for projecting plasma particles onto the substrate; and a selective trap for eliminating or significantly reducing the flow of charged particles towards the substrate while conserving a flow of neutral particles which react to form a passivation layer on the substrate; in which the selective trap comprises a metal grid interposed between the plasma and the substrate, the grid being formed by metal wires crossed at a pitch P that is determined as a function of the characteristics of the plasma to block the flow of charged particles.

According to the invention, the apparatus comprises adaptation means for modifying the Debye length $\lambda D$ of the particles of the plasma, the grid remaining interposed permanently in the flow of particles during deposition, whereby the adaptation means provide a plasma having a Debye length $\lambda D$ that is greater than one-third or half the pitch of the grid during an initial step of non-aggressive deposition, and the adaptation means provide a plasma of Debye length $\lambda D$ that is considerably smaller than one-third or half the pitch of the grid during a following step of rapid deposition.

The apparatus may include a ring for clamping the is substrate onto its support, and the grid may advantageously be insulated from the ring for clamping the substrate on its support, and may be biased to a potential that is different from the potential of the clamping ring.

Other objects, characteristics, and advantages of the present invention appear from the following description of particular implementations, made with reference to the accompanying figures, in which.

Figure 1:
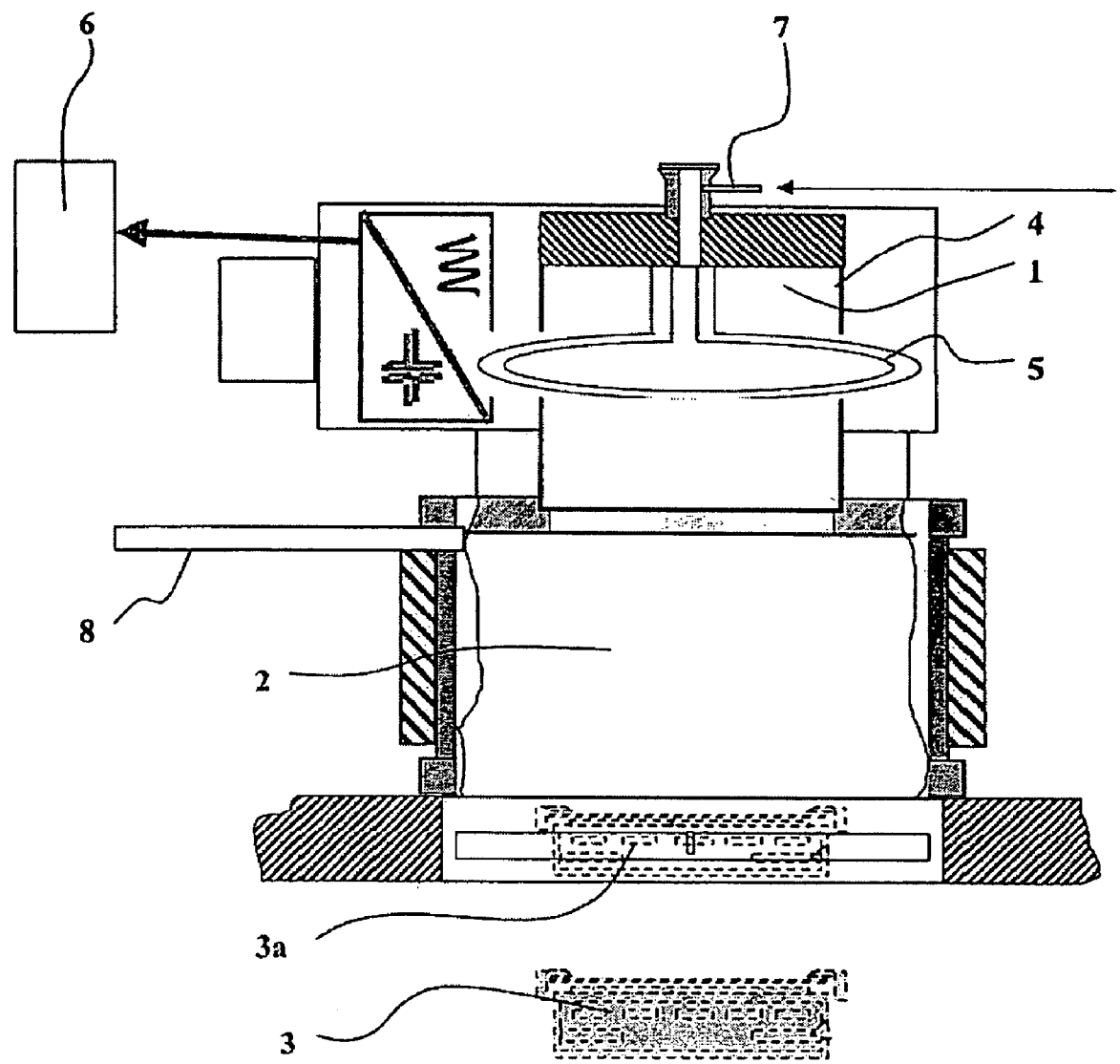
FIG. 1 is an overall diagrammatic view of apparatus for plasma-enhanced chemical vapor deposition using an ICP type plasma source.

Reference is made initially to FIG. 1. Apparatus for plasma-enhanced chemical vapor deposition of a dielectric film comprises a plasma source 1, preferably a high-density ion source in order to be capable of operating properly at a lower operating temperature, followed by a diffusion chamber 2 having a substrate support 3 adapted to hold the substrate for treatment and to be engaged in the diffusion chamber 2, as shown in position 3a.

The plasma source 1 is constituted by an enclosure whose wall 4 is made of dielectric material, it is advantageously cylindrical in shape, being associated with a loop antenna 5 powered by a radiofrequency (RF) electrical generator 6. A gas inlet 7 is provided at the proximal end of the plasma source 1, i.e. at its end remote from the diffusion chamber 2.

The plasma source 1 communicates with the diffusion chamber 2 which is itself adapted to direct the plasma towards a substrate held on the substrate support in position 3a.

The diffusion chamber 2 also includes a post-discharge gas inlet 8 enabling gas to be introduced downstream from the plasma-creation zone, whereas the gas inlet 7 serves to introduce gas upstream from the plasma-creation zone.

To perform a plasma-enhanced chemical vapor deposition method, a substrate is placed on the substrate support 3 which is fitted into position 3a in the diffusion chamber. A suitable vacuum is established inside the plasma source 1 and the diffusion chamber 2, and nitrogen in the form of gaseous nitrogen $N_2$ or ammonia $NH_3$ is introduced at the upstream end via the gas inlet 7, silicon is brought into the diffusion chamber in post-discharge via the post-discharge gas inlet 8 in the form of silane $SiH_4$, and the plasma is generated by powering the RF generator 6. The plasma propagates into the diffusion chamber 2 as far as the substrate carried by the substrate support 3. A deposited layer of silicon nitride $Si_3N_4$ is thus formed on the substrate.

In the same manner, and by using other appropriate gases, it is possible to deposit different layers.

The deposition layer passivates the substrate. However, it will be understood that, at the beginning of the procedure, the substrate is not yet protected by any deposited layer, and is therefore subjected to bombardment by particles of the plasma.

The invention seeks to reduce the harmful effects of bombardment with the charged particles present in the plasma by interposing a selective trap between the plasma and the substrate carried by the substrate support 3.

Figure 2:
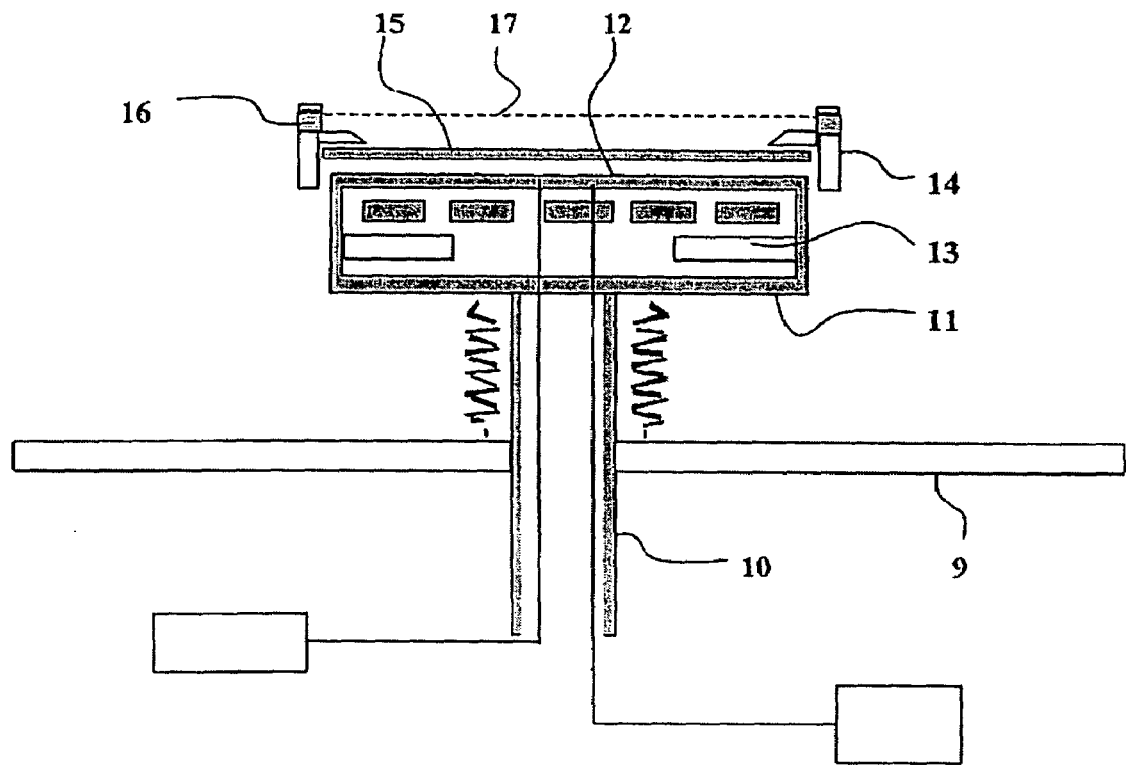
FIG. 2 is a diagrammatic side view in diametral section showing a substrate support provided with a grid constituting an embodiment of the present invention.
Figure 3:
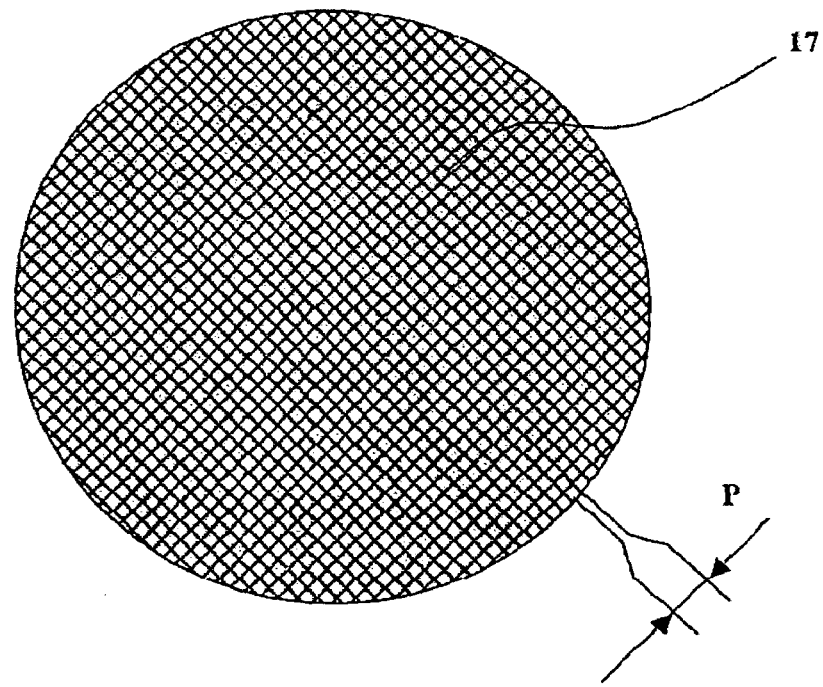
FIG. 3 is a plan view of the grid.

Reference is now made to FIGS. 2 and 3 which show the substrate support 3 in an embodiment of the invention on a larger scale.

In general terms, there can be seen a substrate support plate 9, an axial support column 10 secured to the substrate support plate 9 and carrying a substrate support block 11, itself containing in conventional manner RF electrodes 12, heater means 13, and a clamping ring 14 adapted to hold the substrate 15, e.g. a semiconductor wafer.

In the invention, an insulating ring 16 is fitted to the clamping ring 14, said ring itself holding a grid 17 which overlies the substrate 15 at a suitable distance therefrom and which is parallel to the substrate 15, extending between the substrate 15 and the plasma.

As can be seen in FIG. 3 which is a plan view, the grid 17 is circular in shape, being similar in shape to the semiconductor wafer or substrate 15, and it is formed by orthogonal metal wires crossed at a suitable pitch P.

The pitch P is determined as a function of the characteristics of the plasma, so as to block the flow of charged particles from the plasma and prevent them from reaching the substrate 15, while allowing the neutral particles of the plasma to pass through.

A good selective trapping effect on the charged particles of the plasma is observed when the pitch P of the grid 17 is less than two or three times the Debye length λD of the plasma that is being used.

Figure 4:
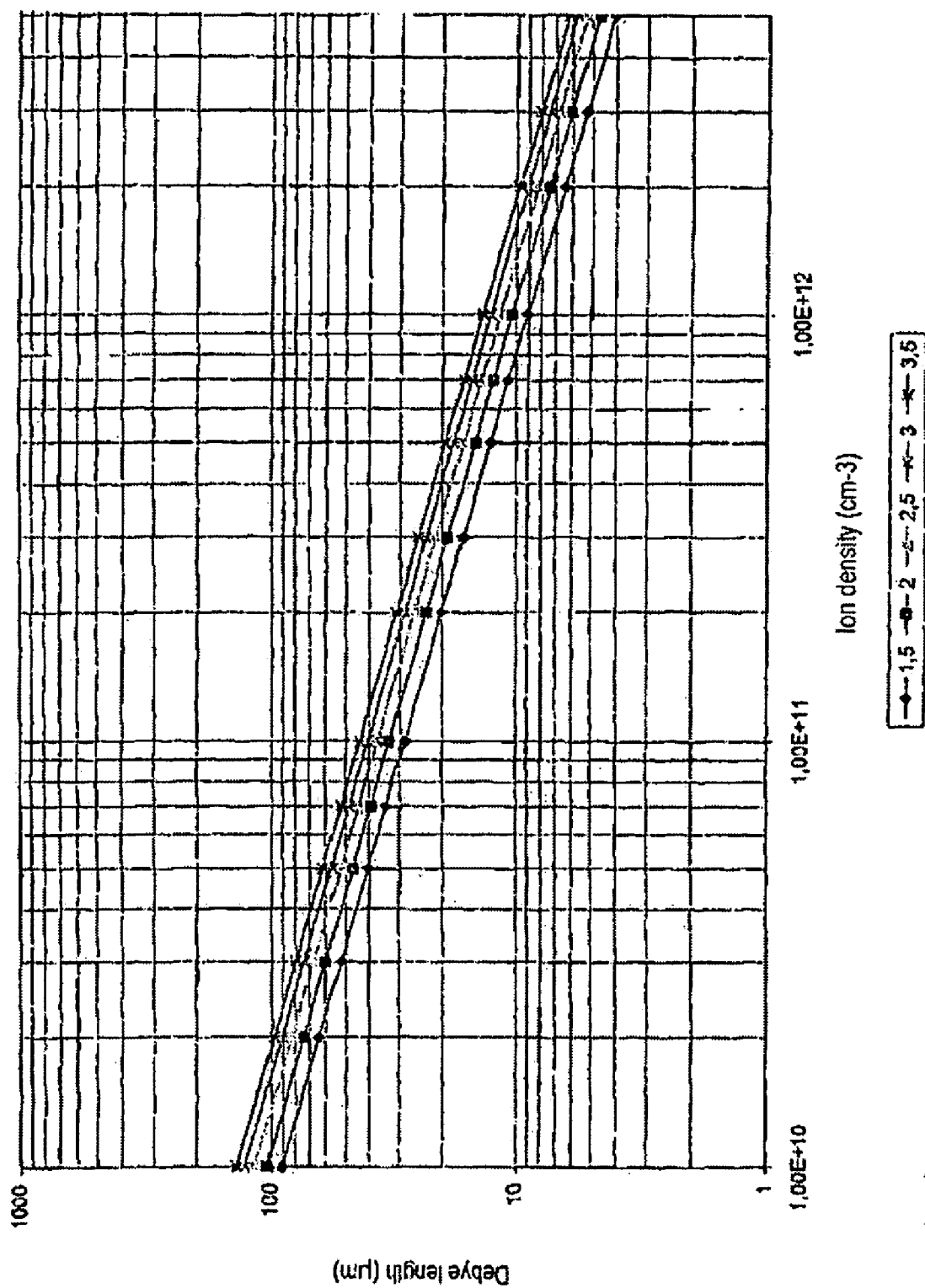
FIG. 4 shows how Debye length varies as a function of substrate ion density and as a function of the electron temperature of the plasma.

Debye length varies as a function of the characteristics of the plasma, in known manner and as shown in FIG. 4.

In particular, the Debye length decreases with increasing density of ions in the plasma, and increases with increasing electron temperature of the plasma. The curves plotted in FIG. 4 show how Debye length varies as a function of ion density for five values of plasma electron temperature varying progressively over the range 1.5 electron volts (eV) to 3.5 eV.

The pitch P of the grid is therefore selected as a function of the properties of the plasma in compliance with the characteristics shown by the curves of FIG. 4.

It is also possible to select the pitch P by taking the following formula into consideration for the Debye length:

$$\lambda D = \left(\frac{KTe}{Ne^2}\right)^{\frac{1}{2}}$$

where N is ion density, and Te is the electron temperature of the plasma.

In practice, a pitch is selected having a value of about 100 microns (μm) so as to ensure that the grid can be made easily.

Ion density may be about $1.00\ E+10\ cm^{-3}$ to $5.00\ E+10\ cm^{-3}$.

Because of the presence of such a grid 17, only the chemical component of the plasma passes through the grid and reaches the substrate 15, while the electrical component formed by the electrically charged particles is trapped by the grid 17 and thus does not reach the substrate 15.

The grid 17 which is insulated from the clamping ring 14 by the insulating ring 16 can be biased to a potential which is different from the potential of the clamping ring 14.

Means are advantageously provided for selectively retracting the grid 17. As a result, the grid 17 is interposed in the particle flow during an initial step of non-aggressive deposition, so as to avoid charged particles passing through it, after which the grid is retracted out from the flow of particles during a following step of rapid deposition, enabling the plasma to act completely on the substrate 15.

In more advantageous manner, by taking into consideration the variation in Debye length as a function of the parameters of the plasma, as shown in FIG. 4, it is possible to modify the selective nature of the trap constituted by the grid 17 by modifying the characteristics of the plasma during the deposition procedure.

Thus, the apparatus may advantageously include adaptation means for modifying the Debye length λD of the particles of the plasma, the grid 17 remaining interposed permanently in the flow of particles during deposition. Under such circumstances, the adaptation means may be means for modifying the ion density of the plasma, or more advantageously, means for modifying the electron temperature Te of the plasma, e.g. by modifying the power of the RF generator 6. Thus, during an initial step of non-aggressive deposition, the adaptation means generate a plasma having a Debye length λD that is greater than one-third or one half of the pitch P of the grid 17, with the same adaptation means producing a plasma having a Debye length λD that is considerably less than one-third or one-half the pitch P of the grid 17 during a following step of rapid deposition.

It will be understood that regardless of whether the selective trapping effect is inhibited during the following step of rapid deposition by moving the grid or by modifying the plasma, it enables the plasma to take full effect in order to generate a deposit on the substrate 15.

The present invention may find advantageous applications, in particular in the use of the apparatus as described above for passivating a semiconductor substrate based on silicon Si, germanium Ge, indium phosphide InP, gallium arsenide GaAs, or a component in columns II to VI of the periodic table of the elements, by means of a passivation layer of the dielectric film type.

The passivation layer may be based on silicon $SiO_2$, or on silicon nitride $Si_3N_4$, for example.

The present invention is not limited to the embodiments described explicitly, and it includes variants and generalizations which are within the competence of the person skilled in the art.

The invention claimed is:

1. A method of depositing dielectric films by plasma-enhanced chemical vapor deposition, in which a substrate in a vacuum is exposed to a flow of particles generated by a plasma, which particles react to form a passivation layer on the substrate, a selective trap being interposed between the plasma and the substrate, thereby reducing the flow of charged particles towards the substrate while conserving a flow of neutral particles, the method being characterized in that it comprises two successive steps:
   a) an initial step of non-aggressive deposition, during which the selective trap effectively reduces the flow of charge particles; and
   b) a following step of deposition, during which the selective trapping effect is inhibited, so that deposition occurs more rapidly than in said initial deposition.

2. A method according to claim 1, in which the selective trapping effect is inhibited by modifying the trap, e.g. by moving it, during said following deposition step.

3. A method according to claim 1, in which the selective trapping effect is inhibited by modifying the properties of the plasma during said following deposition step.

* * * * *